US011490543B2

(12) United States Patent
Ichihashi et al.

(10) Patent No.: US 11,490,543 B2
(45) Date of Patent: Nov. 1, 2022

(54) DC POWER SUPPLY DEVICE

(71) Applicant: KOKI HOLDINGS CO., LTD., Tokyo (JP)

(72) Inventors: Naoto Ichihashi, Hitachinaka (JP); Takuya Yoshinari, Hitachinaka (JP); Yuji Kishima, Hitachinaka (JP)

(73) Assignee: KOKI HOLDINGS CO., LTD., Tokyo (JP)

( * ) Notice: Subject to any disclaimer, the term of this patent is extended or adjusted under 35 U.S.C. 154(b) by 0 days.

(21) Appl. No.: 16/968,242

(22) PCT Filed: Feb. 22, 2019

(86) PCT No.: PCT/JP2019/006741
§ 371 (c)(1),
(2) Date: Aug. 7, 2020

(87) PCT Pub. No.: WO2019/187846
PCT Pub. Date: Oct. 3, 2019

(65) Prior Publication Data
US 2021/0076535 A1 Mar. 11, 2021

(30) Foreign Application Priority Data
Mar. 29, 2018 (JP) .............................. JP2018-065542

(51) Int. Cl.
*H05K 7/20* (2006.01)
*H02M 3/335* (2006.01)
*H02M 7/06* (2006.01)

(52) U.S. Cl.
CPC ........ *H05K 7/20145* (2013.01); *H02M 3/335* (2013.01); *H02M 7/06* (2013.01); *H05K 7/20909* (2013.01)

(58) Field of Classification Search
CPC .......... H05K 7/20145; H05K 7/20909; H02M 3/335; H02M 7/06
See application file for complete search history.

(56) References Cited

U.S. PATENT DOCUMENTS 5,831,240 A * 11/1998 Katooka ................ B23K 9/323
219/130.1
5,831,847 A * 11/1998 Love ................... H05K 7/20945
363/141

(Continued)

FOREIGN PATENT DOCUMENTS

| JP | H11-069617 A | 3/1999 |
| JP | 2003-033032 A | 1/2003 |

(Continued)

OTHER PUBLICATIONS

English Language Translation of International Preliminary Report on Patentability dated Sep. 29, 2020 in corresponding PCT/JP2019/006741.

(Continued)

*Primary Examiner* — Stephen S Sul
*Assistant Examiner* — Alexander Ryan Horton
(74) *Attorney, Agent, or Firm* — NovoTechIP International PLLC

(57) ABSTRACT

A DC power supply device includes a housing including a wall portion, a first opening and a second opening, a circuit portion, a regulation wall portion, and a fan. The first and second openings are formed in the wall portion. The circuit portion includes first and second circuit elements those fixed within the housing. The regulation wall portion provide a first air passage in communication with the first opening, a second air passage in communication with the second opening, and a bent air passage allowing the first air passage and the second air passage to communicate with each other. The fan is configured to generate an air-flow flowing between the (Continued)

first air passage and the second air passage. The fan is positioned to face the first opening. The first circuit element is positioned in the first air passage. The second circuit element is positioned in the second air passage.

13 Claims, 8 Drawing Sheets

(56) References Cited

U.S. PATENT DOCUMENTS

| | | | |
|---|---|---|---|
| 6,286,609 B1* | 9/2001 | Carrier | B25F 5/008 |
| | | | 173/1 |
| 7,205,740 B1* | 4/2007 | Wei | F04D 25/166 |
| | | | 318/434 |
| 7,868,588 B2* | 1/2011 | Altekruse | B60L 53/302 |
| | | | 320/109 |
| 8,462,505 B2* | 6/2013 | Nagami | B23K 9/1006 |
| | | | 219/133 |
| 2011/0075365 A1 | 3/2011 | Tomioka et al. | |
| 2011/0121782 A1* | 5/2011 | Marsh | H02J 7/02 |
| | | | 320/114 |
| 2014/0036439 A1* | 2/2014 | Huang | H05K 7/20727 |
| | | | 361/692 |

FOREIGN PATENT DOCUMENTS

| | | |
|---|---|---|
| JP | 2008-277482 A | 11/2008 |
| JP | 2011-077348 A | 4/2011 |
| JP | 2017-131103 A | 7/2017 |

OTHER PUBLICATIONS

International Search Report and Written Opinion dated Apr. 23, 2019 by the International Searching Authority (Japan Patent Office) in PCT Application PCT/JP2019/006741 (English Translation of the ISR).

* cited by examiner

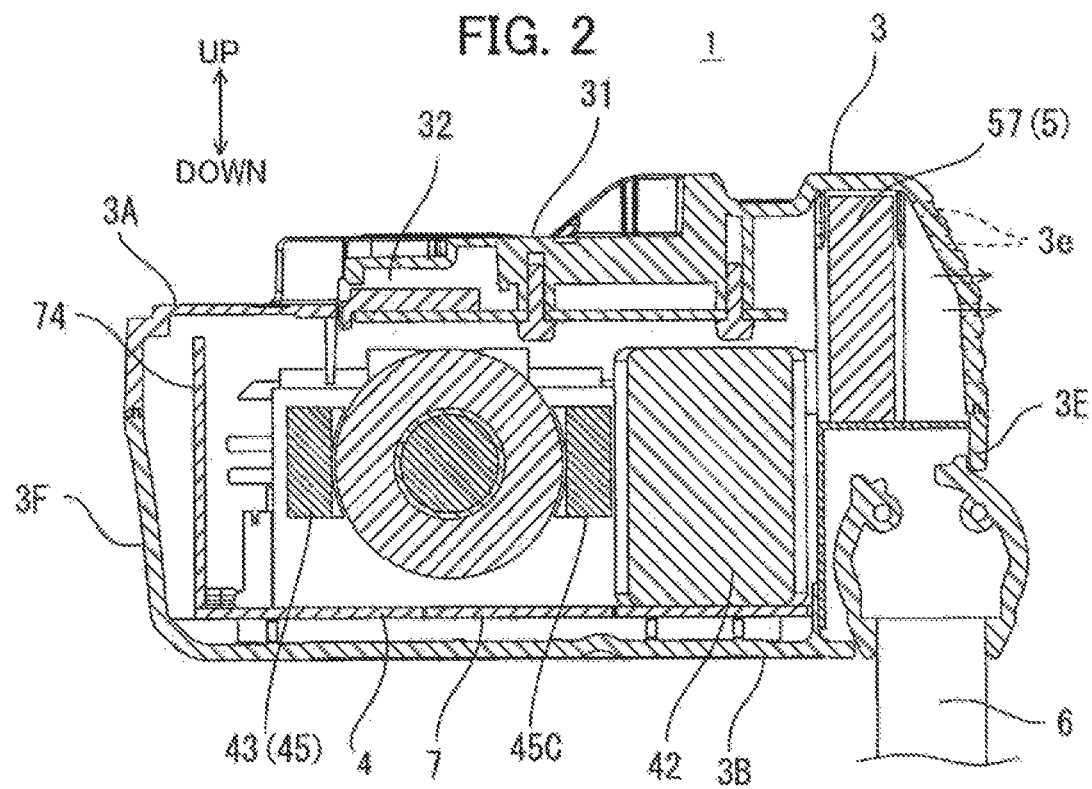
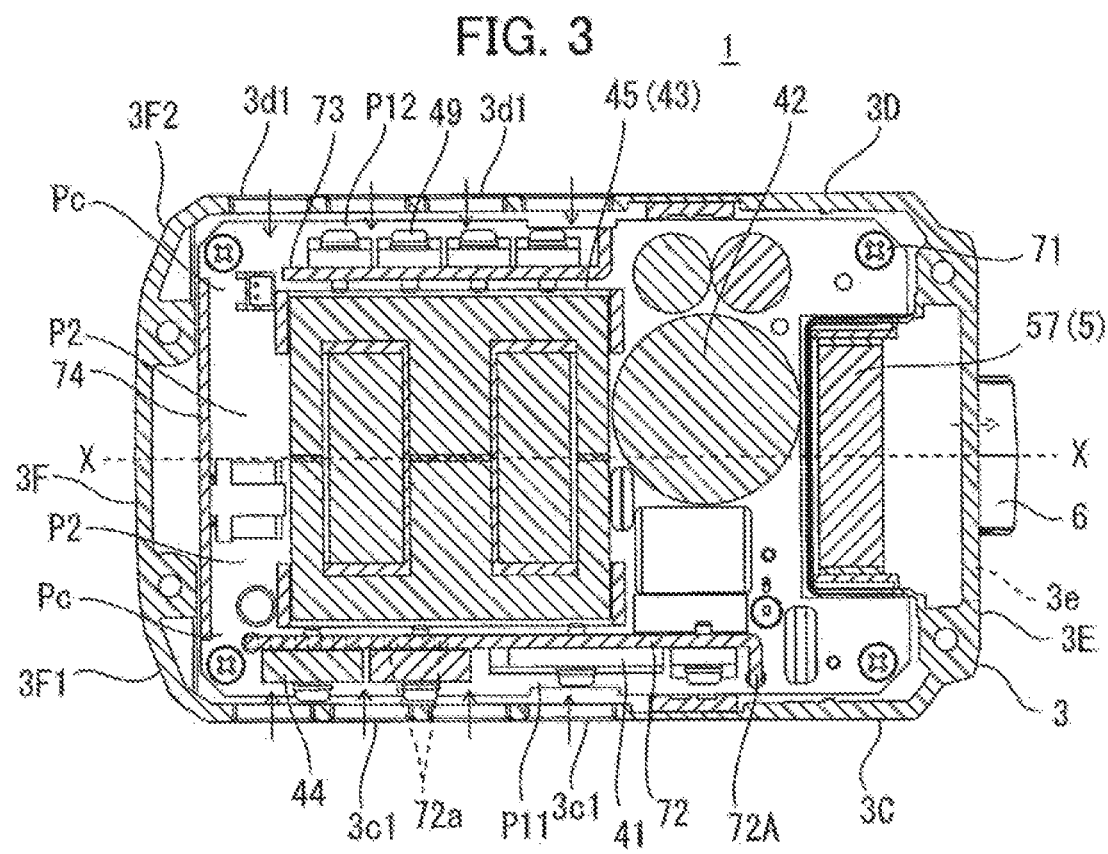

DC POWER SUPPLY DEVICE

TECHNICAL FIELD

The present invention relates to a DC power supply device configured to convert alternating current supplied from an external AC power supply to direct current and output the DC.

BACKGROUND ART

A DC power supply device for use in a power tool is configured to convert alternating current supplied from an external AC power source to direct current and output the direct current to a power tool connected to the power source unit.

CITATION LIST

Patent Literature

[PTL 1] Japanese Patent Application Publication No. 2003-33032

SUMMARY OF INVENTION

Technical Problem

The DC power supply device for use in the power tool includes in its interior a lot of heat generating elements such as a smoothing circuit, a rectification circuit, and a transformation circuit. Efficient cooling to the heat generating elements is required in spite of a dense layout of these circuits within a housing to provide a compact product.

In view of the foregoing, it is an object of the present invention to provide a DC power supply device having a compact size yet capable of efficiently cooling the heat generating elements.

Solution to Problem

In order to attain the object, the present invention provides a DC power supply device that converts alternating current supplied from an external AC power source into direct current and supplies the direct current to a power tool, the DC power supply device including a housing, a first opening and a second opening, a circuit portion, a regulation wall portion, and a fan. The housing includes a wall portion defining an internal space. The first opening and the second opening is formed in the wall portion to communicate an inside of the housing with an outside of the housing. The circuit portion includes a first circuit element and a second circuit element those fixed within the housing and configured to convert the alternating current to the direct current. The regulation wall portion is fixed to tire housing and providing, within the housing and in cooperation with the wall portion, a first air passage in communication with the first opening, a second air passage in communication with the second opening, and a bent air passage allowing the first air passage and the second air passage to communicate with each other. The fan is configured to generate an air-flow flowing between the first air passage and the second air passage through the bent air passage. The fan is positioned to face one of the first opening and the second opening. The first circuit element is positioned in the first air passage. The second circuit element is positioned in the second air passage, With this structure, the air passage where the first air passage, the bent air passage, and the second air passage are successively communicated is formed between the first opening and the second opening upon rotation of the fan. Hence, the overall air passage has a length greater than a length of an air passage provided without employment of the regulation wall portion in the housing. Since the first circuit element and the second circuit element are positioned in the first air passage and the second air passage, respectively, those constituting the air passage, the first and second circuit elements can be efficiently cooled. Further, the air passage can occupy an approximately entire internal space of the housing by a specific shape and layout of the regulation wall portion within the housing, and approximately uniform amount of air-flow can be supplied to any portion within the housing to securely cool the circuit elements within the housing.

Further, in the above-described structure, it is preferable that: the circuit portion includes a rectification circuit configured to rectify the alternating current and a transformation circuit configured to transform voltage output from the rectification circuit and convert the alternating current to direct current; the first circuit element is contained in the rectification circuit; and the second circuit element is contained in the transformation circuit. The rectification circuit and the transformation circuit can be cooled, since the first circuit element contained in the rectification circuit and the second circuit element contained in the transformation circuit those generating heat upon conversion from the alternating current to the direct current are cooled by the air-flow.

Further, in the above-described structure, it is preferable that: the first circuit element includes at least one switching element; and the second circuit element includes a transformer, the switching circuit and the transformer those generating heat due to operation of the DC power supply device are exposed to the air-flow thereby performing efficiently cooling to the switching circuit and the transformer.

Further, in tire above-described structure, it is preferable that; the circuit portion includes an input portion to which the alternating current is input, and an output portion from which the direct current is output; the transformer includes a primary winding contained in the input portion, and a secondary winding contained in the output portion; and the at least one switching element is contained in the input portion. The switching circuit and the transformer those generating heat due to operation of the DC power supply device are exposed to the air-flow thereby performing efficiently cooling to the switching circuit and the transformer.

Further, in the above-described structure, it is preferable that: the regulation wall portion includes a rib protruding from the wall portion of the housing in a direction crossing a direction of the air-flow; and the rib is positioned downstream of the second circuit element in the direction of the air-flow. Since the rib allows the air-flow to flow along the outer peripheral surface of the transformer, a surface area of the transformer with which the air-flow contacts is increased thereby enhancing cooling efficiency to the transformer.

Further, in the above-described structure, it is preferable that the regulation plate is a radiator plate for the at least one switching element. With this structure, heat dissipation from the switching element can be performed by making use of the radiator plate and the air-flow, so that the switching element can be efficiently cooled. Further, the regulation plate also functions as the radiator plate, thereby reducing numbers of parts and components constituting the AC power source unit.

Further, in the above-described structure, it is preferable that: the fan is positioned to face the second opening to suck air inside the housing; and the first opening functions as an air inlet opening and the second opening functions as an air outlet opening. With this structure, the air-flow flowing from the first opening to the second opening through the first air passage, the bent air passage, and the second air passage in turn can be generated, and the air-flow cools the first circuit element and the second circuit element in turn. Hence, the circuit element releasing greater heat generation amount is set as the first circuit element, and the first circuit element can be cooled by the air-flow immediately after introduced through the first opening and that is not warmed.

Further, in the above-described structure, it is preferable that: the fan is positioned to face the second opening to blow air into the housing; and the first opening functions as an air outlet opening and the second opening functions as an air inlet opening. With this structure, the air-flow flowing from the second opening to the first opening through the second air passage, the bent air passage, and the first air passage in turn can be generated, and the air-flow cools the second circuit element and the first circuit element in turn. Hence, the circuit element releasing greater heat generation amount is set as the second circuit element, and the second circuit element can be cooled by the air-flow immediately after introduced through the second opening and that is not warmed.

Further, in the above-described structure, it is preferable that: the first air passage has two passages, and the second air passage is positioned between the two passages; and the two passages are joined, with the second air passage through the bent air passage. With this structure, at least three air passages are formed in the housing to elongate a total length of the air flow. Accordingly, numbers of circuit elements positioned in the first passage can be increased to enhance cooling efficiency by means of air-flow in the DC power supply device.

Further, in the above-described structure, it is preferable that: the regulation wall has a regulation plate having a first surface and a second surface positioned opposite to the first surface; and the first surface constitutes a part of the first air passage; and the second surface constitutes a part of the second air passage. A compact housing can be produced, since the housing is partitioned into the first air passage and the second air passage by the first surface and the second surface of the regulation plate.

Further, in the above-described structure, it is preferable that: the regulation plate has a portion adjacent to the bent air passage; and the portion is formed with at least one through-hole providing communication between the first air passage and the second air passage. With this structure, an amount of air-flow flowing through the air passage formed by the first air passage, the bent air passage, and the second air passage per unit time can be increased. Therefore, cooling efficiency with respect to the first and the second circuit elements can be improved.

Further, in the above-described structure, it is preferable that: the DC power supply device further includes a circuit board on which the first circuit element and the second circuit element is surface-mounted; the wall portion has an upper wall, a lower wall and a side wall connecting the upper wall and the lower wall to each other; the circuit board is provided on the lower wall; the side wall has a bent passage defining portion defining a part of the bent air passage; the first opening and the second opening are formed in the side wall other than the bent passage defining portion; the regulation wall portion is positioned between the upper wall and the circuit board, and the regulation wall portion has one end connected to a portion of the side wall; the portion is adjacent to the first opening and other than the bent passage defining portion; the regulation wall portion extends toward the bend passage defining portion such that another end of the regulation wall portion is positioned away from the bent passage defining portion to provide a bent air passage; and the first circuit element and the second circuit element are oriented in upstanding postures in a direction from the substrate toward the upper wall. With this structure, since tire first circuit element and the second circuit elements are positioned as if these block the first air passage and the second air passage, an increased surface area of the circuit elements can be exposed to the air-flow, to enhance cooling efficiency. Further, since approximately entire space within the housing can be occupied by the air passage, air-flow having approximately uniform intensity can extend to all the details of the internal space of the housing.

Advantageous Effects of Invention

According to the DC power supply device of the present invention, air flow can prevail to a substantially entire space within the housing. Further, the first circuit element and the second circuit element those positioned in the first and second air passages and those generating heat due to conversion from the alternative current to the direct current can be efficiently cooled.

BRIEF DESCRIPTION OF DRAWINGS

FIG. 2 is a vertical cross-sectional view of the AC/DC adapter illustrated in FIG. 1.

FIG. 3 is a transverse cross-sectional view of the AC/DC adapter illustrated in FIG. 1.

DESCRIPTION OF EMBODIMENTS

Hereinafter, a DC power supply device according to one embodiment of the present invention with be described with reference to accompanying drawings.

Figure 1:
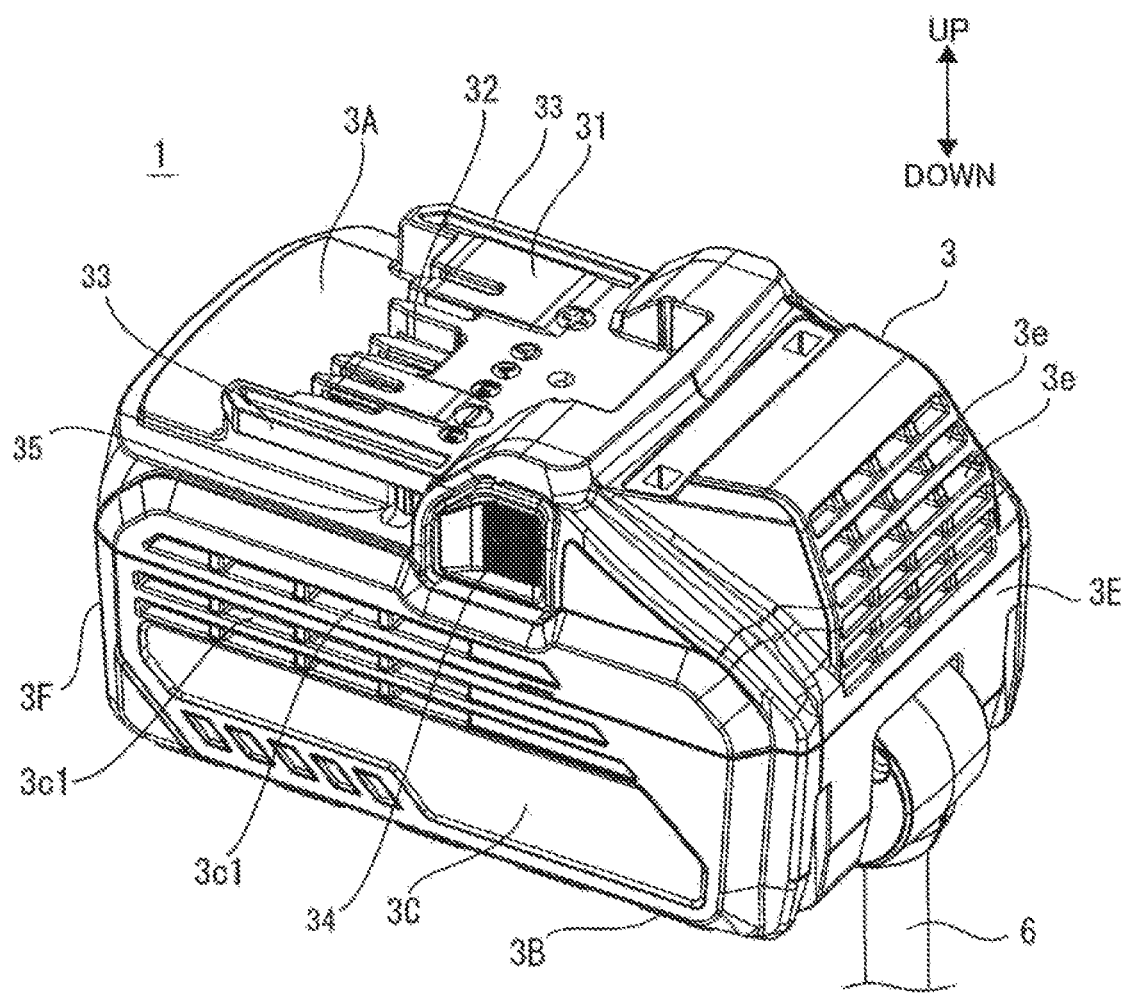
FIG. 1 is a perspective view of an AC/DC adapter according to a first embodiment of the present invention.
Figure 4:
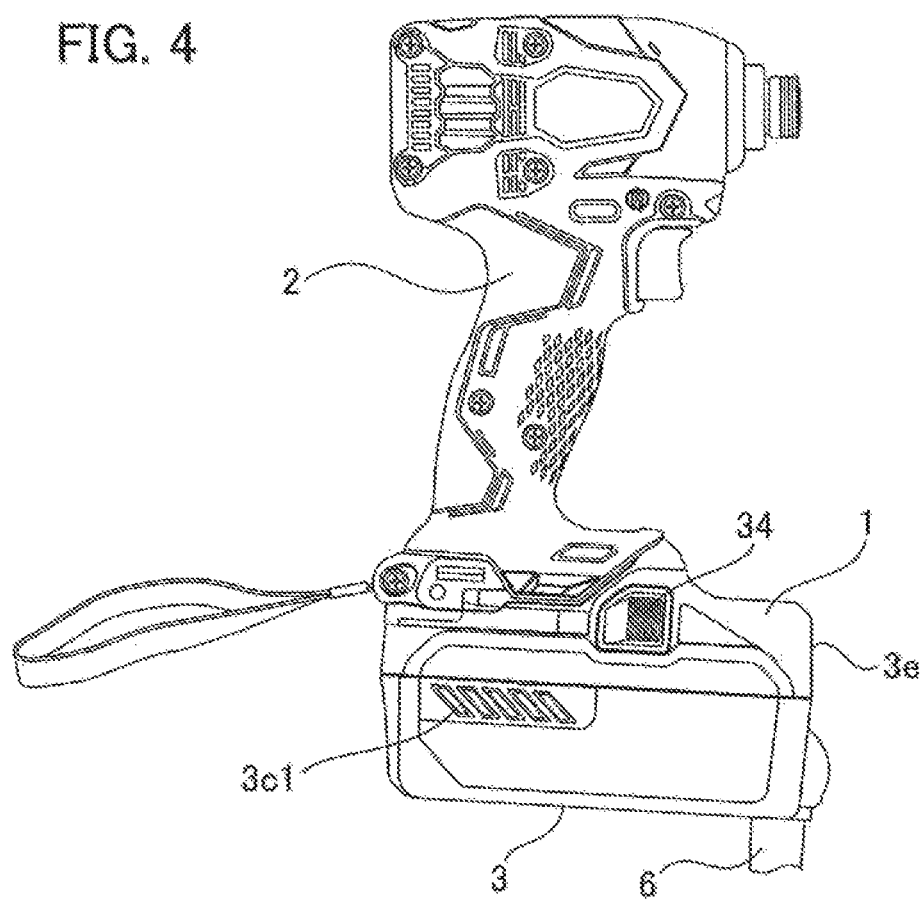
FIG. 4 is a view illustrating an impact driver to which the AC/DC adapter illustrated in FIG. 1 is attached.

An AC/DC adapter 1 according to a first, embodiment of the present invention is illustrated in FIG. 1. The AC/DC adapter 1 is configured to convert alternating current supplied from an externa) commercial power supply CP to direct ament and output the direct current to a power tool 2 (see FIGS. 4 and 5) connected to the AC/DC adapter 1. The AC/DC adapter 1 includes a housing 3 having s shape of a rectangular parallelepiped, a circuit portion 4 positioned in the housing 3 and configured to convert alternating current to direct current, and a fan 5 positioned in the housing 3 for cooling the circuit, portion 4. Incidentally, upward/downward direction is the direction indicated in the drawings unless otherwise specified.

[Housing] As illustrated in FIGS. 1 through 3, the housing 3 includes an upper housing and a lower housing those made from electrically insulating resin, and the upper and lower housing are connected together at a connecting portion to have a shape of an approximately rectangular parallelepiped. Specifically, the housing 3 includes a wall portion defining an internal space and including an upper wall 3A, a lower wall 38, and side walls 3C through 3F connecting the upper wall 3A to the lower wall 3B. The upper wall 3A is provided with a connecting portion 31 for the connection to the power tool 2. The connecting portion 31 is configured to be physically connected to the power tool 2, and includes an output terminal portion 32 including a plurality of terminals configured to be electrically connected to a circuit portion of the power tool 2.

Figure 5:
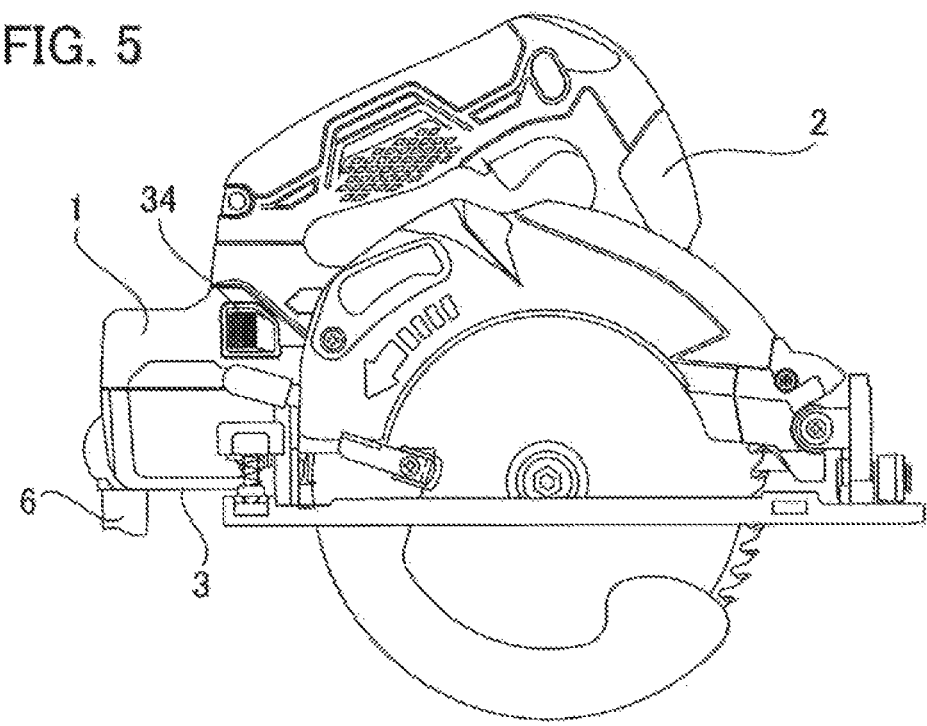
FIG. 5 is a view illustrating a portable electrically powered circular saw to which the AC/DC adapter illustrated in FIG. 1 is attached.

Rails 33 extending parallel to the upper wall 3A is provided on the connecting portion 31. The rails 33 are configured to be engaged with rails (not illustrated) of the power tool 2. A latch operating portion 34 is provided on each of the side walls 3C and 3B facing the side wall 3C. Bach of the rails 33 is provided with a latch engagement portion 35 movable in interlocking relation to the latch operating portion 34. In accordance with engagement and sliding movement between the rails 33 and the rails (not illustrated) of the power tool 2, a protruding portion (not illustrated) provided on the power tool 2 is brought into engagement with the latch engagement portion 35, so that the power tool 2 and the housing 3 are relatively immovably fixed to each other. Upon operation to the latch operating portion 34 in a state where, the power tool 2 and the housing 3 are relatively immovably fixed to each other, the latch engagement portion 35 is moved to disengage the protruding portion (not illustrated) of the power tool 2 from the latch engagement portion 35, so that the power tool 2 and the housing 3 become relatively movable. In this way, fixing and unfixing between the housing 3 and the power tool 2 can be switchable by the operation to the latch operating portion 34. For example, an impact driver illustrated in FIG. 4 and a portable electrically powered circular saw illustrated in FIG. 5 are typical examples of the power tool 2 to which the AC/DC adapter 1 is attached. The impact driver and the portable electrically powered circular saw become operable upon power supply from the AC/DC adapter 1.

As illustrated in FIG. 3, the side walls 3C through 3F includes first and second side walls 3C, 3D each extending in a long side direction and facing with each other approximately in parallel, and third and fourth side walls 3E, 3F extending in a narrow side direction and facing with each other approximately in parallel. As illustrated in FIG. 1, the first side wall 3C is formed with a plurality of first air holes 3el each having small generally rectangular shape. The second side wall 3D is also formed with a plurality of first air holes 3dl each having small generally rectangular shape. The third side wall 3E is formed with a plurality of second air holes 3e each having small generally rectangular shape. The fourth side wall 3F has portions adjacent to the first and second side, walls 3C, 3D. The portions are bent passage defining portions 3F1, 3F2 described later. Each first air hole is an example of a first opening, and each second air hole is an example of a second opening.

Figure 6:
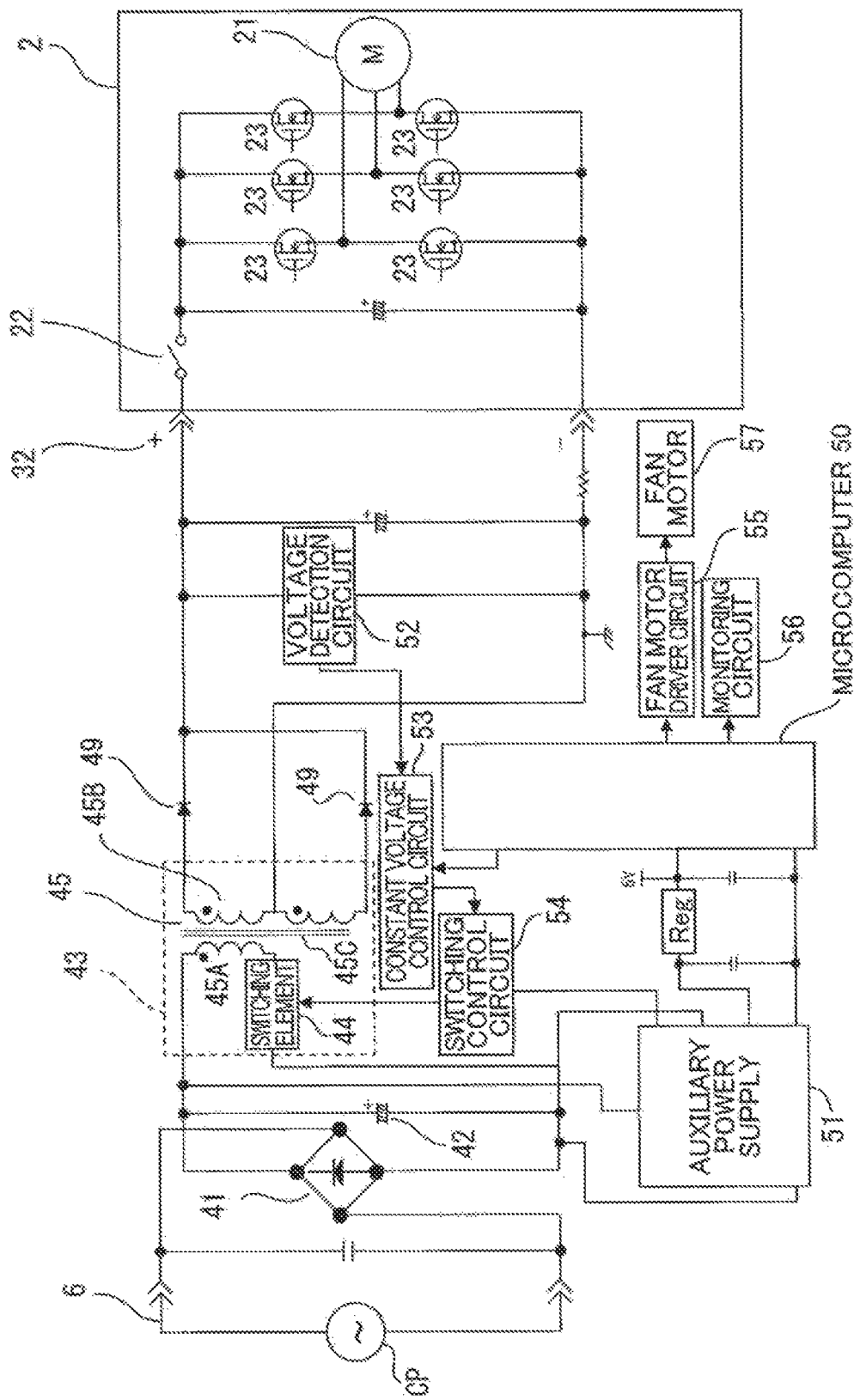
FIG. 6 is a circuit diagram of the AC/DC adapter illustrated in FIG. 1.

[Circuit portion] As illustrated in FIG. 6, the circuit portion 4 includes a rectification circuit, a smoothing circuit, and a transformation circuit 43 in this order from an input side toward an output side, AC power from the external commercial power supply CP is input to the rectification circuit through a power source cord 6 (FIG. 1). The rectification circuit is constituted by a bridge diode 41 where the input alternating current is subjected to full-wave rectification and the rectified current is output. The smoothing circuit is constituted by a capacitor 42 for smoothing the voltage output from the rectification circuit. The transformation circuit 43 is configured to transform the input voltage to a desired voltage level and output the direct current to the output terminal 32.

The transformation circuit 43 includes a switching element 44 and a transformer 45. The transformer 45 includes a core 45C, a primary winding 45A and a secondary winding 45B those wound over the core 45C. The switching element 44 is connected in series to the primary winding 45A of the transformer 45 for regulating electric power flowing into the primary winding 45A. The secondary winding 458 has one end and another end each connected to a positive electrode of the output terminal portion 32 through a diode 49. Further, the secondary winding 45B has a neutral point grounded and connected to a negative electrode of the output terminal portion 32.

The power tool 2 is physically and electrically connectable to the output, terminal portion 32. An impact driver and a portable electrically powered circular saw are exemplified as the power tool 2 where a brushless motor 21 is used as a power source, and an end bit (not illustrated) is used for operation. In the power tool 2, on/off operation is controlled by a switch 22, and the brushless motor 21 is actuated by a switching operation of six switching elements 23. Incidentally, a combination of the rectification circuit, the smoothing circuit, the switching element 44, and the primary winding 45A of the transformer 45 constitutes an input portion of the circuit portion 4. On the other hand, a combination of the (secondary winding 45B of the transformer 45 and the diodes 49, and the output terminal portion 32 constitutes an output portion of the circuit portion 4.

The circuit portion 4 includes a microcomputer 50 for controlling output power. The microcomputer 50 is operated by electric power from an auxiliary power supply 51. The circuit portion 4 further includes a voltage detection circuit 52 for detecting output voltage, a constant voltage control circuit 53, and a switching control circuit 54 for controlling switching operation of the switching element 44 to output electrical power having a predetermined voltage level from the output terminal portion 32. Further, a fan motor driver circuit 55 and a monitoring circuit 56 are connected to the microcomputer 50. The fan motor driver circuit 55 is configured to drive a fan motor 57 for rotating the fan 5. The monitoring circuit 56 includes an LED for displaying a state of the AC/DC adapter 1.

As Illustrated in FIG. 2, the fan 5 is fixed to the housing 3 together with the fan motor 57 at a position adjacent to the third side wall 3E and in confrontation with the second air holes 3e such that a rotation shaft (not illustrated) of the fan extends approximately parallel to a longitudinal direction of the housing 3. The fan 5 is rotatable by the actuation of the fan motor 57 so as to generate an air flow inside the housing 3.

Figure 7:
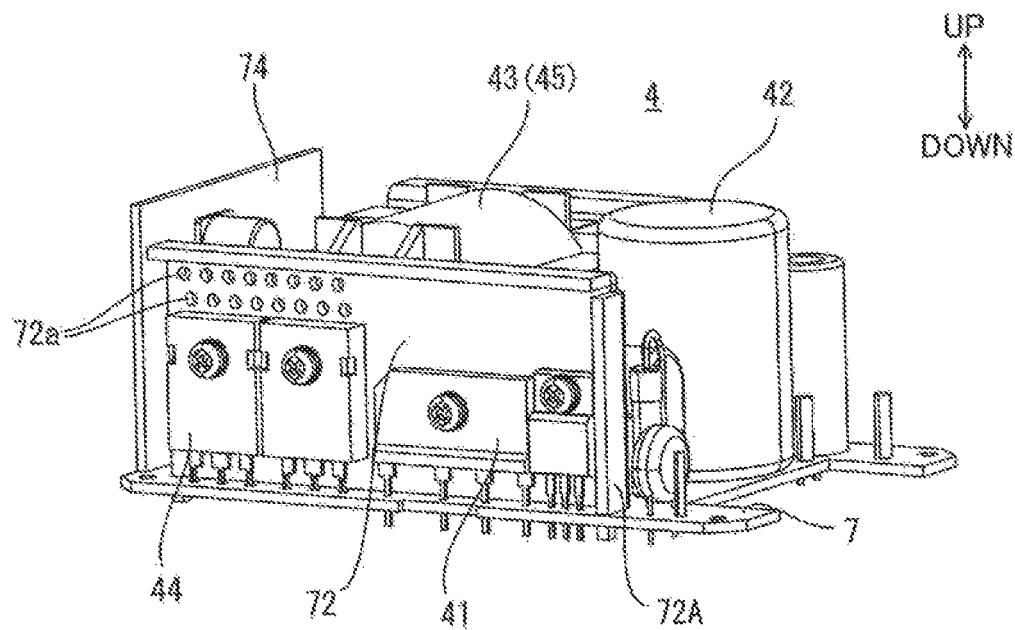
FIG. 7 is a perspective view of a circuit element and a radiator plate those surface-mounted on a circuit board.
Figure 8:
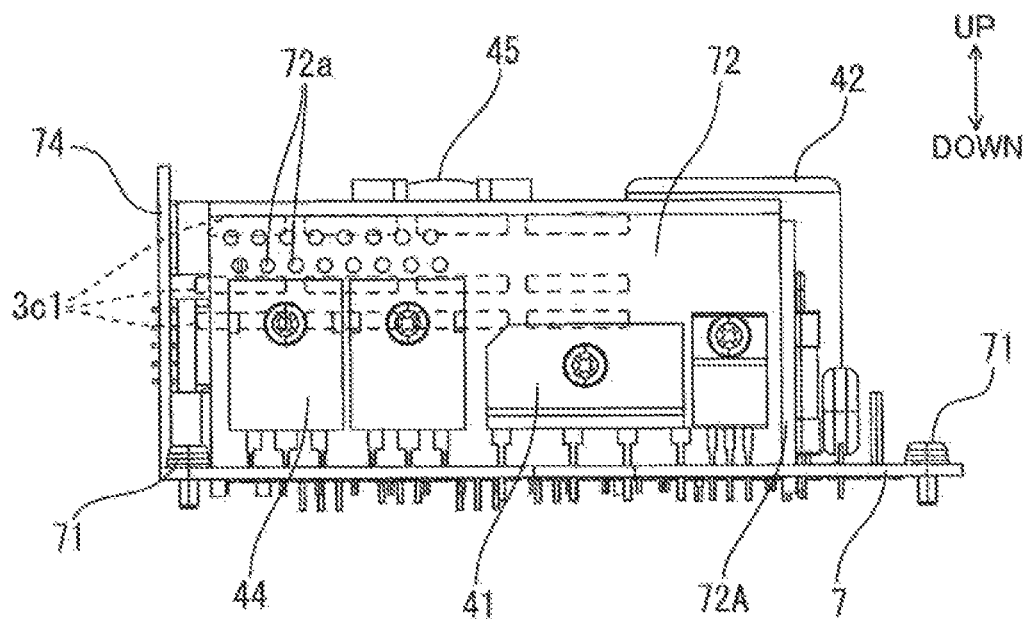
FIG. 8 is a side view of the circuit element and the radiator plate those surface-mounted on the circuit board.

As illustrated in FIG. 7, the circuit portion 4 is constituted by the bridge diode 41, the capacitor 42, the switching element 44, the transformer 45, and the diodes 49 those surface-mounted on a circuit hoard 7.

The circuit board 7 is in a form of a flat plate having generally rectangular shape, and is fixed to the lower wall 3B of the housing 3 by male threads 71 (see FIG. 3). The circuit board 7 has a surface feeing the upper wall 3A. The bridge diode 41, the capacitor 42, the switching element 44, and the transformer 45 those are circuit elements for constituting the circuit portion 4 are surface-mounted on the surface facing the upper wall 3A as illustrated in FIGS. 2 and 7. Incidentally, the bridge diode 41, the switching element 44, and the transformer 45 are examples of a first circuit element and a second circuit element.

According to the depicted embodiment, as illustrated in FIGS. 3 and 7, a first radiator plate 72 is fixed to the circuit board 7 such that the first radiator plate 72 upstands from the circuit board 7 toward the upper wall 3A and extends along the first side wall 3C with a predetermined distance therefrom toward the bent passage defining portion 3F to a position distant therefrom by a prescribed distance. Further, a second radiator plate 73 is fixed to the circuit board 7 such that the second radiator plate 73 upstands from the circuit board 7 toward the upper wall 3A and extends along the second side wall 3D with a predetermined distance therefrom toward the bent passage defining portion 3F2 to a position distant therefrom by a prescribed distance. The first radiator plate 72 and the second radiator plate 73 are made from metal having high heat conductivity such as, for example, aluminum. The first radiator plate 72 and the second radiator plate 73 are examples of a regulation wall portion and a regulation plate.

The first radiator plate 72 has a portion close to the fourth side wall 3F. The portion is formed with a plurality of circular through-holes 72a extending throughout a thickness of the first radiator plate 72. The through-holes 72a formed in the first radiator plate 72 and the first air holes 3cl formed in the first side wall 3C have positional relationship therebetween in upward/downward direction in that the through-holes 72a are overlapped with the first air holes 3cl as viewed in a facing direction between the side walls 3C and 3D. That is, a distance between the through-holes 72a and the circuit hoard 7 is approximately equal to a distance between the first air holes 3cl and the circuit board 7.

The bridge diode 41 and the switching element 44 are directly attached to a surface of the first radiator plate 72, the surface facing the first side wall 3C, to promote radiation of heat from the bridge diode 41 and the switching element 44. As illustrated in FIG. 3, the first radiator plate 72 has an end portion close to the third side wall 3E. The end portion is a bent portion 72A blocking a gap between tire first side wall 3C and the first radiator plate 72.

The diodes 49 are directly attached to a surface of the second radiator plate 73, the surface facing the second side wall 3D, to promote radiation of heat from the diodes 49. As illustrated in FIG. 3, the second radiator plate 73 has an end portion close to the third side wall 3B. The end portion is a bent portion 73A blocking a gap between the second side wall 3D and the second radiator plate 73.

Further, as illustrated in FIGS. 3 and 7, the fan 5, the capacitor 42, and the transformer 45 are positioned in this order in a direction from the third side wall 3E to the fourth side wall 3F at an area defined between the first radiator plate 72 and the second radiator plate 73, and the capacitor 42 and the transformer 45 are surface-mounted on the circuit board 7. The transformer 45 is positioned with a proper insulation distance from tire first radiator plate 72 and the second radiator plate 73. That is, a distance between tire first radiator plate 72 and the second radiator plate 73 those fixed to the circuit board 7 is set in accordance with a size of the transformer 45. Further, the primary winding 45A of the transformer 45 is positioned to face the first radiator plate 72, and tire secondary winding 45B is positioned to face the second radiator plate 73.

Further, an auxiliary circuit board 74 is fixed at a position adjacent to the fourth side wall 3F and extends therealong. The microcomputer 50 is surface-mounted on the auxiliary circuit board 74.

[Operation in AC/DC adapter 1] Next, operation in the AC/DC adapter 1 will be described.

The AC/DC adapter 1 is attached to the 2 is attached to the power tool 2, and the power source cord 6 is connected to the commercial power supply CP. Upon turning on the switch 22 of the power too 2, direct current power with output voltage of, for example, 36V that is converted from alternating current to the direct current in the AC/DC adapter 1 is supplied from the AC/DC adapter 1 to the power tool 2 through the output terminal portion 32. At this time, the fan 5 rotates within the housing 3. In accordance with rotation of the fan 5, a flow of air directing from the fan 5 to the second air holes 3e is generated, so that, air is introduced into the housing 3 through the first air holes 3cl, 3dl. In this way, air flows along an air passage defined inside the hosing 3 from the first air holes 3cl, 3dl, and the air is discharged outside of the housing 3 through the second air holes 3e.

The air passage is formed inside the housing 3 from the first air holes 3cl, 3dl to the second air holes 3c. Specifically, as illustrated in FIG. 3, the air passage includes first air passages P11, P12 in communication with the first air holes 3cl, 3dl, a second air passage P2 in communication with the second air holes 3e, and bent air passages Pc permitting the first air passages P11, P12 to communicate with the second air passage P2. Incidentally, these air passages have upper ends defined by the upper wall 3A of the housing 3, and have lower ends defined by the lower wall 3B of the housing 3 or the circuit board 7.

In the depicted embodiment, since the first air holes 3cl, 3dl are formed in the side walls 3C, 3D of the housing 3, the first air passages P11, P12 are generally symmetrically positioned with each other with respect to an imaginary center line X extending in the longitudinal direction of the housing 3. One of the first, air passages P11, P12 (the first air passage P11) is defined between the first side wall 3C of the housing 3 and the first radiator plate 72 and has one end portion in communication with the first air holes 3cl and has another end portion in communication with the bent air passage Pc. Remaining one of the first air passages P11, P12 (the first air passage P12) is defined between the second side wall 3D of the housing 3 and the second radiator plate 73 and has one end portion in communication with the first air holes 3dl and has another end portion in communication with the bent air passage Pc. The second air passage P2 has one end portion in communication with the bent air passages Pc and defined between the first radiator plate 72 and the second radiator plate 73, and has another end portion in communication with the second air holes 3e.

The bent air passages Pc are positioned between the first air passages P11, P12 and the second air passage P2 to permit the first air passages P11, P12 and the second air passage P2 to communicate with each other. For example, one of the bent air passages Pc for communication between the first air passage P11 and the second air passage P2 is defined by the upper wall 3A of the housing 3, the end portion of the first radiator plate 72, and the bent passage defining portion 3F1. Further, remaining one of the bent air passages Pc for communication between the first air passage P12 and the second air passage P2 is defined by the upper wall 3A of the housing 3, the end portion of the second radiator plate 73, and the bent passage defining portion 3F2. In this way, two first air passages P11, P12 are converged into the second air passage P2 through the bent air passages Pc.

Air flows through, the first air passages P11, P12 from the first air holes 3cl, 3dl, and then is introduced into the second air passage P2 through the bent air passages Pc, and then flows through the second air passage P2 and is discharged outside of the housing 3 through the second air holes 3e.

Within the first air passage PH, the bridge diode 41 and the switching element 44 those fixed to the first radiator plate 72 are exposed to the air-flow in this order. Hence, the bridge diode 45 and the switching element 44 those generating heat due to operation of the AC/DC adapter 1 are cooled by the air-flow. Within the first air passage P12, the diodes 49 fixed to the second radiator plate 73 are exposed to the air-flow. Hence, the diodes 49 generating heat due to operation of the AC/DC adapter 1 are cooled by the air-flow.

Air-flows moved past the first air passages P11, P12 are introduced into the bent air passages pc, and flowing direction of the air-flows is changed by the fourth side wall 3F so that the air-flows are introduced into the second air passage P2. Within the second air passage P2, the transformer 45 and the capacitor 42 are exposed to the air flow in this order. Hence, the transformer 45 and the capacitor 42 those generating heat due to operation of the AC/DC adapter 1 are cooled by the air-flow. Then, warmed air conducting heat away from the bridge diode 41, the switching element 44, the transformer 45, and the capacitor 42 is discharged outside of the housing 3 through the second air holes 3e.

As described above, because of the formation of the first air passages P11, P12, each of the circuit elements generating heat due to operation of the AC/DC adapter 1 can be positioned to be enclosed by the air-flow flowing through the first air passages P11, P12. Since the circuit elements constituting the circuit portion 4 are arrayed in line in the flowing direction of the air-flow, approximately entire outer surface of each of the circuit elements can be exposed to the air-flow that is generally uniformly flowing. Accordingly, heat dissipation from the approximately entire surface of each circuit element can be promoted. Thai is, efficient cooling to tire heated circuit elements can be performed.

Further, the side walls 3C, 3D, 3F and the radiator plates 72 and 73 are utilised for partitioning the internal space of the housing 3 to define the air passages, whereby a desired region can be provided as the air flow path. Specifically, circuit elements positioned in the air passages can be involved in the air-flow approximately in their entirety. Hence, the circuit elements can be efficiently cooled.

Further, the radiator plates 72, 73 are used for partitioning the housing 3 to provide the air passages. Therefore, exclusive parts for the partition is unnecessary, thereby avoiding increase in numbers of parts and components for the AC/DC adapter 1. Further, the radiator plates 72, 73 are used for the formation of the air passages, and air flows along the surface of the radiator plates 72, 73. Hence, air-flow promotes heat dissipation from the radiator plates 72, 73, thereby enhancing heat, dissipating effect in the radiator plates 72, 73.

Further, the layout of the radiator plates 72, 73 relative to the housing 3 can adjust a length of each air passage and a cross-sectional area of the air passage taken along a plane perpendicular to moving direction of the air-flow. Therefore, a design of layout of the circuit elements on the circuit board dependent on the size of the circuit board can be facilitated. Further, air passages may be provided over an entire area of the housing 3 to allow the air-flow having substantially uniform intensity to reach all the details of the housing by the control to shape, size and position of the radiator plates 72, 73.

Further, since the plurality of circular through-boles 72a are formed in the first radiator plate 72 at the position close to the bent air passages Pc, the air-flow can directly flows from the first air passage P11 to the second air passage P2 by the air introduction through-holes 72a without air introduction through the bent air passage Pc. With this structure, decrease in amount of air flowing from the first air passage P11 into the second air passage P2 can be prevented, so that the circuit elements such as the transformer 45 that is positioned in the second air passage P2 and that is heated can be efficiently cooled. Further, air resistance of air flowing from the first air passage P11 to the second air passage P2 can be reduced, while maintaining a surface area of the find, radiator plate 72 along which air frictionally flows.

Further, the air passages can lie positively adjusted by the first radiator plate 72 and the second radiator plate 73 in the housing 3. Therefore, the housing 3 can be made compact for downsizing of the AC/DC adapter 1.

Figure 9:
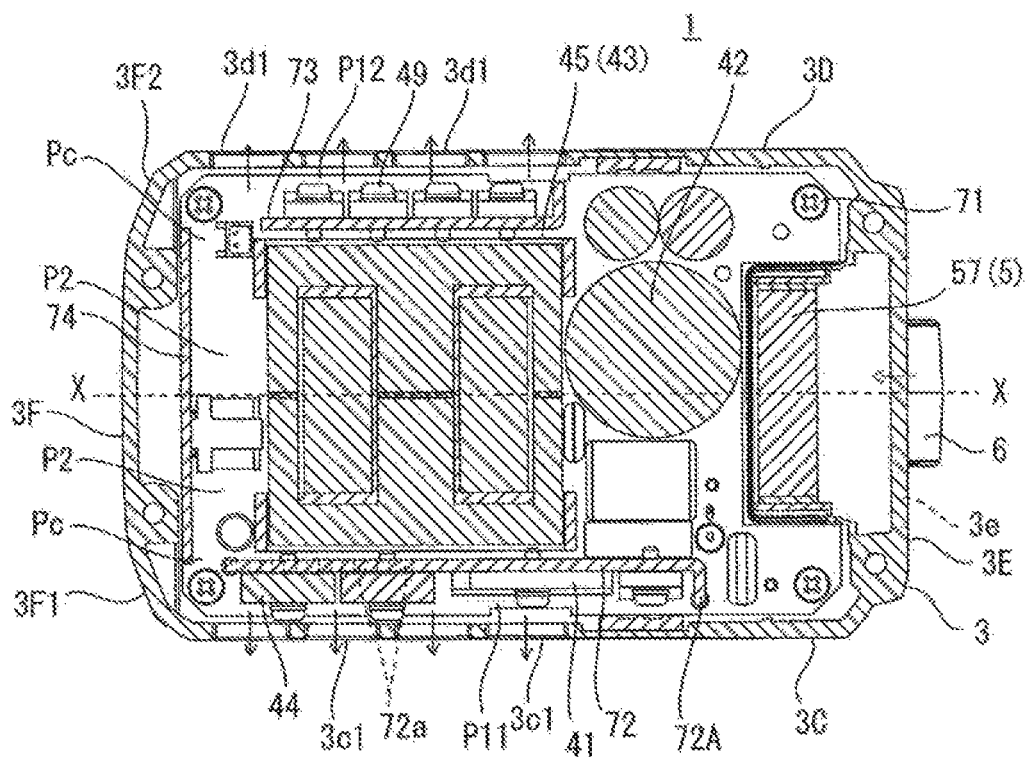
FIG. 9 is a transverse cross-sectional view of the AC/DC adapter illustrated in FIG. 1.

Incidentally, a direction of air-flow determined by the fan 5 and illustrated in FIG. 3 can be reversed as illustrated in FIG. 9 such that air is introduced through the second air holes 3e, flows through tire second air passage P2, and then the first air passages P11, P12, and is discharged outside of the housing 3 through the first air holes 3cl, 3dl. In this case, the air flows through the second air holes 3e, the second air passage P2, the bent air passages Pc, the first air passages P11, P12, and the first air boles 3cl, 3dl, in this order to cool the circuit elements such as the transformer 45, the switching element 44, and the bridge diode 41. Specifically, after the air introduced into the second air passage P2 through the second air holes 3e flows through the second air passage F2, the air-flow is branched into the two first air passages P11 and P12 by the bent air passages Pc, and after the air flows through the first air passage P11, P12, the air is discharged outside of the housing 3 through the first air holes 3cl. 3dl. Since the transformer 45 whose heat generation amount is relatively large can be cooled by the not-warmed air-flow introduced in the housing 3 through the second air holes 3e, enhanced cooling efficiency to the transformer 45 can be attained.

Figure 10:
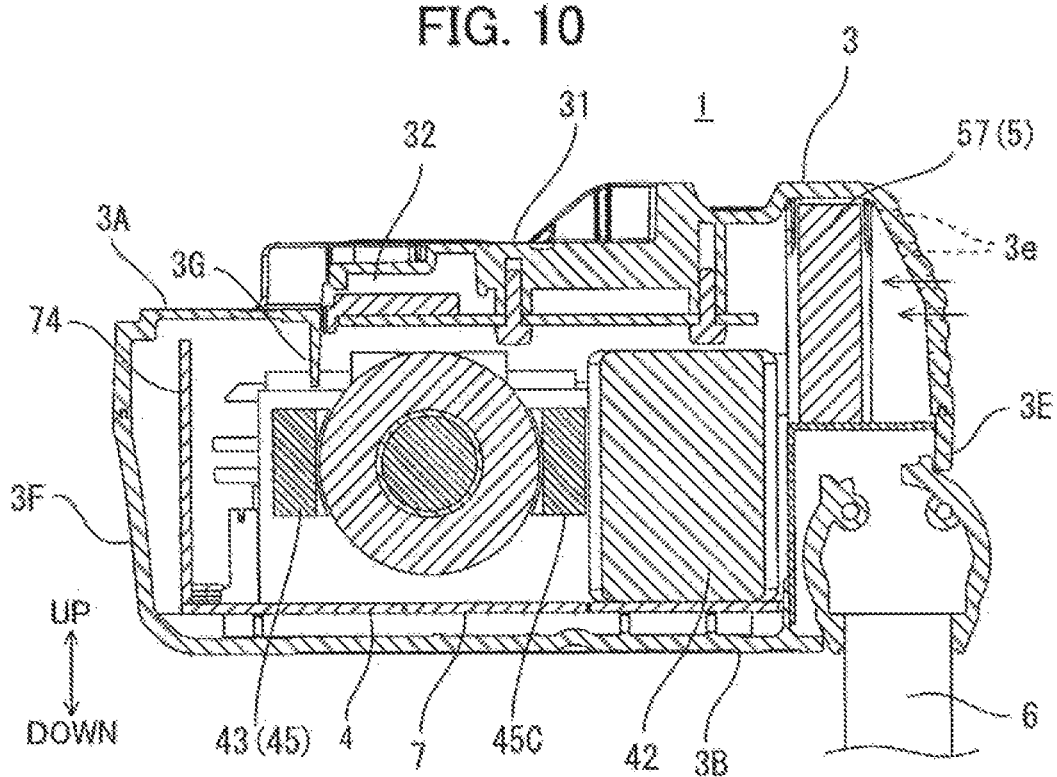
FIG. 10 is a vertical cross-sectional view of an AC/DC adapter according to a modification to the first embodiment.

Incidentally, the present embodiment may include as illustrated in FIG. 10 a rib 3G extending from the upper wall 3A of the housing 3 toward the circuit board 7 at a position downstream of the transformer 45 in the air flowing direction so as to permit the air-flow flowing toward the fourth side wall 3F to be flowed along the outer peripheral surface of the transformer 45. With such a structure, an outer peripheral surface area of the transformer 45 that is exposed to the air-flow can be increased, to thus enhance the cooling efficiency to the heated transformer 45.

Figure 11:
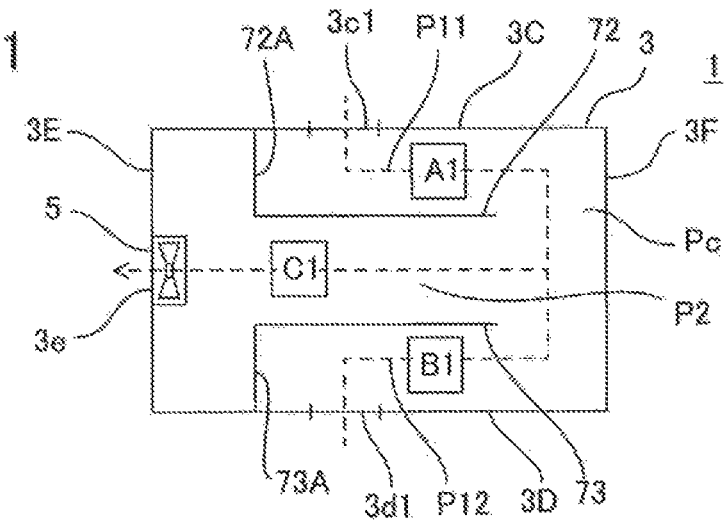
FIG. 11 is a conceptual diagram of the AC/DC adapter illustrated in FIG. 1.

FIG. 11 is a conceptual diagram illustrating the above-described embodiment. Rotation of the fan 5 upon power supply to the power tool 2 permits the air to be introduced into the first air passage P11 through the first air holes 3el, and at the same time, permits the air to be introduced into the first air passage P12 through the first air holes 3dl, so that the circuit elements A1 and B1 positioned in the first air passages P11 and P12 are cooled. Then, the air is introduced into the second air passage P2 through the bent air passages Pc, so that the circuit element C1 positioned in the second air passage P2 is cooled. Then, the air is discharged outside of the housing 3 through the second air holes 3e.

Figure 12:
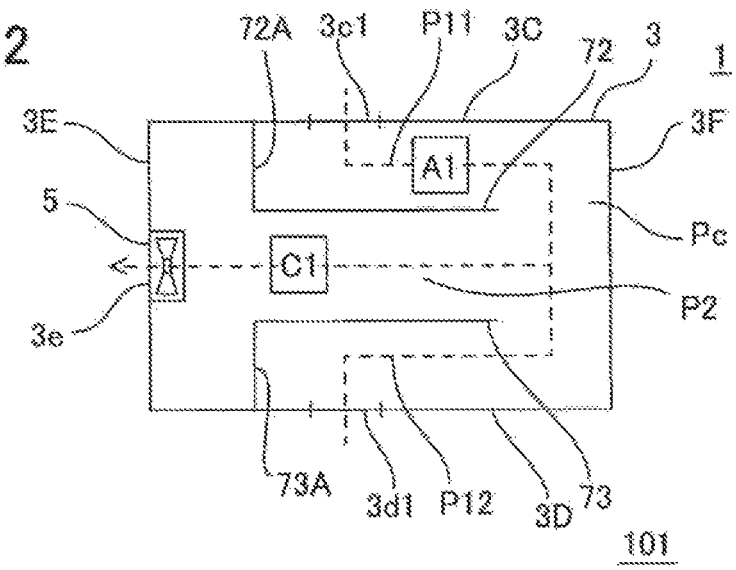
FIG. 12 is a conceptual diagram of an AC/DC adapter according to a modification to the adapter illustrated in FIG. 11.

Incidentally, as illustrated in FIG. 12, in a case where tire circuit element is not positioned in the first air passage P12, the air flowing through the first air passage P12 is not warmed by the heat dissipation from the circuit element. Hence, temperature of the air just introduced into the second air passage P2 is lower than the temperature of the air in ease of FIG. 11. Accordingly, the circuit element C1 positioned in the second air passage P2 can be cooled with the air-flow having the temperature lower than that of the air-flow in case of FIG. 11. Consequently, enhanced cooling efficiency to the circuit element C1 can be attained.

[Modifications] Modified embodiments will be described wills reference to FIGS. 13 through 15.

Figure 13:
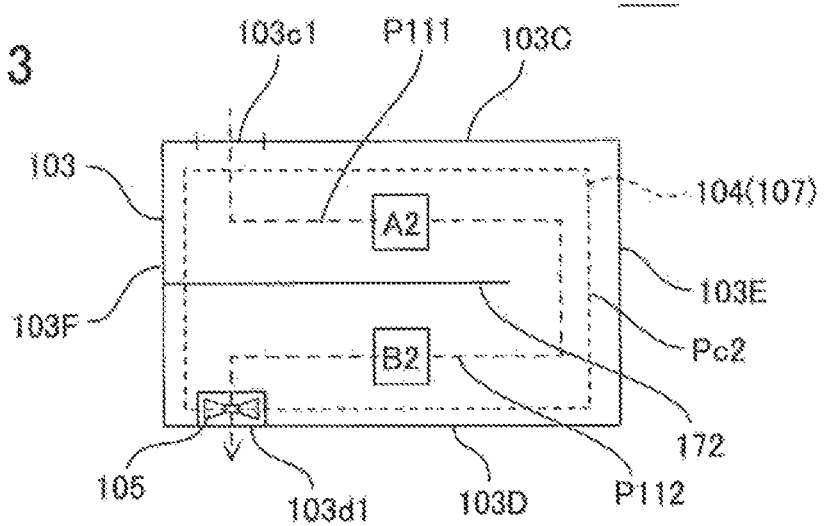
FIG. 13 is a conceptual diagram of an AC/DC adapter according to another modification.

FIG. 13 is a conceptual diagram illustrating an AC/DC adapter 101. A housing 103 includes a first side wall 103C and a second side wall 103D where a first opening 103cl and a second opening 103dl are formed, respectively, at a position adjacent to a fourth side wall 103F. A circuit portion 104 includes a circuit board 107 and a single radiator plate 172 mounted on the circuit hoard 107 and having a first surface and a second surface. The radiator plate 172 has one end portion connected to the fourth side wall 103P and extends toward a third side wall 103E to define a bent air passage Pc2 in cooperation with the housing 103. Further, the first surface of the radiator plate 172 defines a first air passage P111 in cooperation with the housing 103, and the second surface of the radiator plate 172 defines a second air passage 112 in cooperation with the housing 103.

The first air passage P111 has one end in communication with the first opening 103cl, and another end in communication with the bent air passage Pc2. In the first air passage P111, a first circuit element A2 heated and required to be cooled is surface-mounted on the substrate 107. On the other hand, the second air passage P112 has one end in communication with the second opening 103dl through a fan 105, and another end in communication with the bent air passage Pc2. In the second air passage P112, a second circuit element B2 heated and required to be cooled is surface-mounted on the substrate 107. Rotation of tire fan 107 generates m air-flow flowing through the first air passage P111, the bent air passage Pc2, and the second air passage P112 from the first opening 103cl to the second opening 103dl. Hence, the first circuit element A2 and the second circuit element B2 can be efficiently cooled, since approximately entire outer surfaces of the first and second circuit elements A2, B2 are encompassed by the air-flow.

Figure 14:
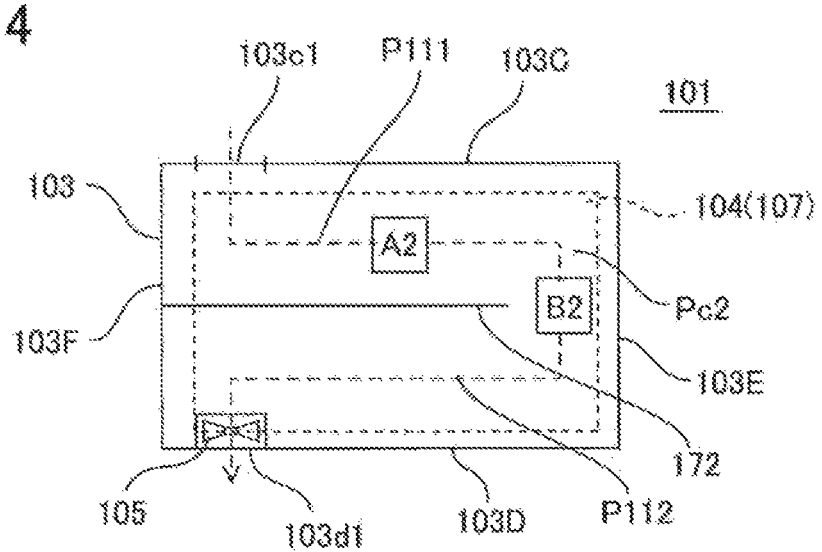
FIG. 14 is a conceptual diagram of an AC/DC adaptor according to a still another modification.
Figure 15:
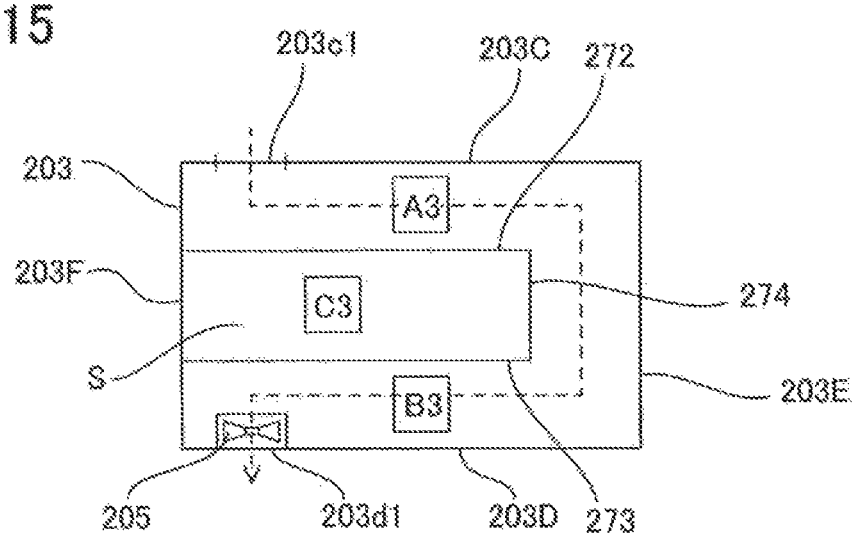
FIG. 15 is a conceptual diagram of an AC/DC adapter according to a still another modification.

Incidentally, as illustrated in FIG. 14, the second circuit element B2 may be surface-mounted on the circuit board 107 in the bent air passage Pc2. With this structure, the second circuit element B2 can be efficiently cooled, since approximately entire outer surface of the second circuit element B2 is encompassed by the air-flow flowing through the bent air passage Pc2, similar to the embodiment illustrated in FIG. 13.

According to the embodiments illustrated in FIGS. 13 and 14, increase in number of parts and components of the AC/DC adapter 101 can be obviated since the air passage inside the housing 103 is defined by making use of the radiator plate 172, and at the same time, enhanced heat dissipating effect in the radiator plate 172 can be obtained since the air-flow flows along the first and second surfaces of the radiator plate 172.

Further, the structure for allowing the air-flow to spread into desired regions by making use of the radiator plate to set the air passage inside the housing from the first opening to the second opening may be reversely utilized. That is, as illustrated hi FIG. 15, a space S where no air-flow exists can be intentionally set inside a housing 203. The housing 203 includes first and second side walls 203C, 203D facing with each other and extending in approximately parallel to a direction of long side, and third and fourth side walls 203E and 203F facing with each oilier and extending in approximately parallel to a direction of a narrow side. For example, in FIG. 15, a first radiator plate 272 and a second radiator plate 273 have one ends connected to the fourth side plate 203P, and have another ends connected to each other by a flat plate 274 to form a closed space S inside the housing 203. A circuit element C3 to which cooling by the air-flow is unnecessary is positioned in the space S. Rotation of a fan 205 generates air-flow flowing from the first opening 203cl through the first air passage, the bent air passage, and the second air passage to the second opening 203dl. The circuit elements A3, B3 are cooled by the air-flow, since these elements are positioned in the first air passage and file second air passage. On the other hand, the circuit element C3 is not cooled by the air-flow, since the element is positioned inside the space S and is not exposed to the air-flow.

In this way, the circuit element to be cooled can be intensively and efficiently cooled by the regulation plate of the present invention.

While the description is made to the AC/DC adapter 1 to which the present invention is applied, the present invention is also applicable to a suitable DC power supply device including circuit elements that is to be cooled.

REFERENCE SIGNS LIST

1: AC/DC adapter, 2: power tool, 3: housing, 3A: upper wall, 3B: lower wall, 3C, 3D, 3E, 3F: side wall, 3cl, 3dl: first opening, 3e: second opening, 4: circuit portion, 5: fan, 7: circuit board, 41: bridge diode, 42: capacitor, 43: transformation circuit, 44: switching element, 45: transformer, 72, 73: radiator plate

The invention claimed is:

1. A DC power supply device that converts an alternating current supplied from an external AC power source into a direct current and supplies the direct current to a power tool, the DC power supply device comprising:
   a housing comprising a wall portion defining an internal space, the wall portion including a first wall and a second wall;
   a first opening formed in the first wall and a second opening formed in the second wall to communicate an inside of the housing with an outside of the housing;
   a circuit portion comprising a first circuit element and a second circuit element those fixed within the housing and configured to convert the alternating current to the direct current, wherein the second circuit element comprises a transformer;
   a regulation wall portion fixed to the housing and providing, within the housing and in cooperation with the wall portion, a first air passage in communication with the first opening, a second air passage in communication with the second opening, and a bent air passage allowing the first air passage and the second air passage to communicate with each other, the regulation wall portion including a regulation plate which extends in parallel to the first wall; and a fan configured to generate an air-flow flowing between the first air passage and the second air passage through the bent air passage, wherein the first circuit element comprises at least one switching element, wherein the fan is positioned to face the second opening, wherein the regulation plate is a radiator plate on which the at least one switching element is positioned, wherein the regulation plate is overlapped with the first opening when viewing in a direction perpendicular to the first wall, wherein the first circuit element is positioned in the first air passage, wherein the first circuit element is positioned between the regulation plate and the first opening in the direction perpendicular to the first wall, wherein the second circuit element is positioned in the second air passage, wherein the regulation plate has a first surface and a second surface that are both parallel to the first wall, the second surface being a back surface of the regulation plate relative to the first surface of the regulation plate, and wherein the first surface forms a first part of the first air passage, and the second surface is disposed to face the transformer.

2. The DC power supply device according to claim 1, wherein the circuit portion comprises a rectification circuit configured to rectify the alternating current; and a transformation circuit configured to transform voltage output from the rectification circuit and convert the alternating current to direct current, wherein the first circuit element is contained in the rectification circuit, and wherein the second circuit element is contained in the transformation circuit.

3. The DC power supply device according to claim 1, wherein the circuit portion comprises an input portion to which the alternating current is input, and an output portion from which the direct current is output, wherein the transformer comprises a primary winding contained in the input portion, and a secondary winding contained in the output portion, and wherein the at least one switching element is contained in the input portion.

4. The DC power supply device according to claim 1, wherein the regulation wall portion comprises a rib protruding from the wall portion of the housing in a direction crossing a direction of the air-flow, the rib being positioned downstream of a center of the second circuit element in the direction of the air-flow.

5. The DC power supply device according to claim 1, wherein the fan is positioned to face the second opening to suck air inside the housing, the first opening functioning as an air inlet opening and the second opening functioning as an air outlet opening.

6. The DC power supply device according to claim 1, wherein the fan is positioned to face the second opening to blow air into the housing, the first opening functioning as an air outlet opening, and the second opening functioning as an air inlet opening.

7. The DC power supply device according to claim 1, wherein the first wall comprises two walls, and the regulation plate comprises two plates, wherein the first air passage has:

one passage defined between one of the two walls and one of the two plates; and another passage defined between remaining one of the two walls and remaining one of the two plates, and wherein the second air passage is defined between the two plates, and wherein the one passage and the another passage are joined with the second air passage through the bent air passage.

8. The DC power supply device according to claim 1, wherein the first air passage is substantially perpendicular to the second air passage, and wherein an end portion of the regulation plate separates a portion of the first air passage, which extends along the first surface of the regulation plate at the end portion, from the second air passage, which extends along the second surface of the regulation plate at the end portion.

9. The DC power supply device according to claim 8, wherein the regulation plate has a portion adjacent to the bent air passage, the portion being formed with at least one through-hole providing communication between the first air passage and the second air passage.

10. The DC power supply device according to claim 1, further comprising a first circuit board on which the first circuit element, the second circuit element and the regulation wall portion are surface-mounted, the first circuit board facing the first air passage, the second air passage and the bent air passage.

11. The DC power supply device according to claim 10, further comprising:

a second circuit board on which a controller configured to control operation of the first circuit element is mounted; and an output terminal portion including a plurality of terminals configured to be electrically connected to the power tool, wherein the first circuit board is positioned below the second air passage, wherein the second circuit board is positioned beside the second air passage in a horizontal direction, wherein the fan is positioned opposite to the second circuit board with respect to the second air passage, and wherein the output terminal portion is positioned above the second air passage.

12. The DC power supply device according to claim 11, wherein the wall portion comprises an upper wall, a lower wall and a side wall connecting the upper wall and the lower wall to each other, the side wall including the first wall and the second wall, wherein the first circuit board is provided on the lower wall, wherein the side wall comprises a bent passage defining portion defining a part of the bent air passage, wherein the first opening and the second opening are formed in the side wall other than the bent passage defining portion, wherein the regulation wall portion is positioned between the upper wall and the first circuit board, and the regulation wall portion has one end connected to a portion of the side wall, the portion being adjacent to the first opening and other than the bent passage defining portion, the regulation wall portion extending toward the bent passage defining portion such that another end of the regulation wall portion is positioned away from the bent passage defining portion to provide a bent air passage, and wherein the first circuit element and the second circuit element are oriented in upstanding postures in a direction from the first circuit board toward the upper wall.

13. A DC power supply device configured to convert an alternating current supplied from an external AC power source into a direct current and supplies the direct current to a power tool, the DC power supply device comprising:
- a housing comprising a pair of side walls extending in parallel to each other, each of the pair of side walls having a first opening to communicate an inside of the housing with an outside of the housing;
- a transformer fixed within the housing and configured to convert the alternating current to the direct current; and
- a pair of radiator plates extending in parallel to the pair of side walls and fixed to the housing and providing an air passage within the housing and in cooperation with the side walls,
- wherein the pair of radiator plates is arranged in the housing such that the transformer interposes the pair of radiator plates therebetween in a direction perpendicular to the pair of side walls, and the pair of radiator plates sandwiches the transformer such that one surface of the transformer faces a first one of the pair of radiator plates and an opposite surface of the transformer faces a second one of the pair of radiator plates.

* * * * *